(12) United States Patent
Takizawa

(10) Patent No.: US 8,957,736 B2
(45) Date of Patent: Feb. 17, 2015

(54) OSCILLATION METHOD AND OSCILLATION CIRCUIT

(71) Applicant: Akira Takizawa, Ueda (JP)

(72) Inventor: Akira Takizawa, Ueda (JP)

( * ) Notice: Subject to any disclaimer, the term of this patent is extended or adjusted under 35 U.S.C. 154(b) by 0 days.

(21) Appl. No.: 14/033,907

(22) Filed: Sep. 23, 2013

(65) Prior Publication Data

US 2014/0176247 A1  Jun. 26, 2014

(30) Foreign Application Priority Data

Dec. 21, 2012 (JP) ................... 2012-279044

(51) Int. Cl.
*H03K 3/03* (2006.01)
*H03B 27/00* (2006.01)
*H03B 1/00* (2006.01)

(52) U.S. Cl.
CPC ............ *H03B 1/00* (2013.01); *H03B 27/00* (2013.01); *H03K 3/0315* (2013.01)
USPC .................... 331/57; 331/44; 331/45; 331/56; 327/153; 327/161

(58) Field of Classification Search
USPC ......... 324/76.12, 76.39, 76.54, 149; 327/153, 327/161; 331/44–46, 50, 52, 55–57
See application file for complete search history.

(56) References Cited

U.S. PATENT DOCUMENTS

| | | | | |
|---|---|---|---|---|
| 5,668,507 A | * | 9/1997 | Boerstler et al. | 331/78 |
| 6,075,417 A | * | 6/2000 | Cheek et al. | 331/44 |
| 6,137,369 A | * | 10/2000 | Kermani | 331/45 |
| 7,208,934 B2 | * | 4/2007 | King et al. | 324/76.39 |
| 7,260,754 B2 | * | 8/2007 | Lee | 714/724 |
| 7,365,611 B2 | * | 4/2008 | Ikeda et al. | 331/44 |
| 7,420,870 B2 | * | 9/2008 | Park et al. | 365/233.1 |
| 2011/0007615 A1 | | 1/2011 | Fujiwara et al. | |

FOREIGN PATENT DOCUMENTS

| | | |
|---|---|---|
| JP | 06-188634 A | 7/1994 |
| JP | 2005-094754 A | 4/2005 |
| JP | 2007-274431 A | 10/2007 |
| JP | 2008-205580 A | 9/2008 |
| JP | 2010-50591 A | 3/2010 |
| JP | 2011-19053 A | 1/2011 |

* cited by examiner

*Primary Examiner* — Levi Gannon

(74) *Attorney, Agent, or Firm* — Birch, Stewart, Kolasch & Birch, LLP

(57) ABSTRACT

The oscillation method uses an oscillation circuit in which a plurality of MOSFETs are annularly connected. The method comprises the steps of: forming GND of the circuit, which is separated from GND of a driving electric source of the MOSFETs, in a part of a first connection line which connects the MOSFET with the adjacent MOSFET; connecting a probe with a second connection line which connects another MOSFET with the adjacent MOSFET, an odd number of the MOSFETs being connected between the GND and the second connection line; and generating an oscillation waveform between the probe and the GND.

1 Claim, 8 Drawing Sheets

OSCILLATION METHOD AND OSCILLATION CIRCUIT

CROSS-REFERENCE TO RELATED APPLICATION

This application is based upon and claims the benefit of priority of the prior Japanese Patent Application No. P2012-279044, filed on Dec. 21, 2012, and the entire contents of which are incorporated herein by reference.

FIELD

The present invention relates to an oscillation method and an oscillation circuit.

BACKGROUND

An odd number of inverters are connected and form a closed circuit so as to form an oscillator. This circuit has been publicly known as a ring oscillator.

Japanese Laid-open Patent Publication No. 2010-50591 discloses a ring oscillator which is capable of generating higher frequencies.

The ring oscillator disclosed in the Japanese Laid-open Patent Publication No. 2010-50591 comprises: a square-shaped main loop circuit including four inverters (an even number of inverters); and a plurality of triangle-shaped loop circuits, each of which includes three inverters (an odd number of inverters) and which act as energizing circuits.

Further, Japanese Laid-open Patent Publication No. 2011-19053 discloses an oscillator comprising: a plurality of main rings, in each of which three inverters are annularly connected; a phase connection ring, in which a plurality of inverters are annularly connected; first connection nodes being respectively provided to the main rings, the first connection nodes of the main rings being respectively connected with different second connection nodes of the phase connection ring; and resistances acting as second phase connection elements, which connect the second connection nodes of the phase connection ring with each other.

The above described conventional oscillators oscillate mere pulse waves. The inventor of the present invention has studied so as to generate a step-like pulse, which includes at least two rising edges and two trailing edges. For example, a step-like pulse including two rising edges and two trailing edges has a maximum value, an intermediate value and a minimum value. Thus, the inventor of the present invention found that calculation of plus values and minus values could be easily performed by regarding the intermediate value as zero. In case of performing calculation with using the conventional pulse waves, setting a complement number for minus values is required. On the other hand, in case of using the step-like pulse waves, minus values can be directly calculated.

SUMMARY

Accordingly, it is an object to provide an oscillation method and an oscillation circuit capable of solving the above described problem of the conventional technologies Namely, the oscillation method and the oscillation circuit of the present invention are capable of generating step-like pulse waves.

To achieve the object, the present invention has following structures.

Namely, the oscillation method of the present invention uses an oscillation circuit in which a plurality of MOSFETs are annularly connected. The method comprises the steps of:

forming GND of the circuit, which is separated from GND of a driving electric source of the MOSFETs, in a part of a first connection line which connects the MOSFET with the adjacent MOSFET;

connecting a probe with a second connection line which connects another MOSFET with the adjacent MOSFET, an odd number of the MOSFETs being connected between the GND and the second connection line; and generating an oscillation waveform between the probe and the GND.

With this method, step-like pulse waves can be generated.

The oscillation circuit of the present invention comprises a first parallel star-connected circuit, a second parallel star-connected circuit and a third parallel star-connected circuit, which have a same circuit configuration, each of the parallel star-connected circuits includes a first star-connected circuit having six small circuits, in each of which three inverters are annularly connected, the inverters are connected to flow an electric current clockwise in three of the small circuits, the inverters are connected to flow the electric current counterclockwise in the rest three small circuits, the six selected inverters, each of which is one selected from the three inverters constituting each of the small circuits, are connected to form a hexagonal shape, anodes of the inverters are connected at three corners of the hexagonal shape, cathodes of the inverters are connected at the rest three corners thereof, the anodes of the inverters are respectively connected at the three corners at each of which the cathodes are connected, and the cathodes connected at the rest three corners are connected at a cathode connection point, each of the parallel star-connected circuit includes a second star-connected circuit having six small circuits, in each of which three inverters are annularly connected, the inverters are connected to flow the electric current clockwise in three of the small circuits, the inverters are connected to flow the electric current counterclockwise in the rest three small circuits, the six selected inverters, each of which is one selected from the three inverters constituting each of the small circuits, are connected to form a hexagonal shape, anodes of the inverters are connected at three corners of the hexagonal shape, cathodes of the inverters are connected at the rest three corners thereof, the cathodes of the inverters are respectively connected at the three corners at each of which the anodes are connected, and the anodes connected at the rest three corners are connected at an anode connection point, in each of the parallel star-connected circuits, the two small circuits of the first star-connected circuit and the two small circuits of the second star-connected circuit are shared to connect the first star-connected circuit with the second star-connected circuit, and the anode connection point of the first parallel star-connected circuit is connected with the cathode connection point of the second parallel star-connected circuit, the anode connection point of the second parallel star-connected circuit is connected with the cathode connection point of the third parallel star-connected circuit, and the anode connection point of the third parallel star-connected circuit is connected with the cathode connection point of the first parallel star-connected circuit.

With this structure, step-like pulse waves can be generated between any anode connection point of the three parallel star-connected circuits and any corner constituted by the small circuits provided around said anode connection point.

In the oscillation method and the oscillation circuit of the present invention, the step-like pulse waves can be generated.

BRIEF DESCRIPTION OF THE DRAWINGS

Embodiments of the present invention will now be described by way of examples and with reference to the accompanying drawings.

DETAILED DESCRIPTION OF THE EMBODIMENTS

Preferred embodiments of the present invention will now be described in detail with reference to the accompanying drawings.

Firstly, the oscillation method of the present invention will be explained.

A ring oscillator, in which MOSFETs are annularly connected, has been known. The present embodiment is characterized by output points for outputting pulse waves.

Figure 1:
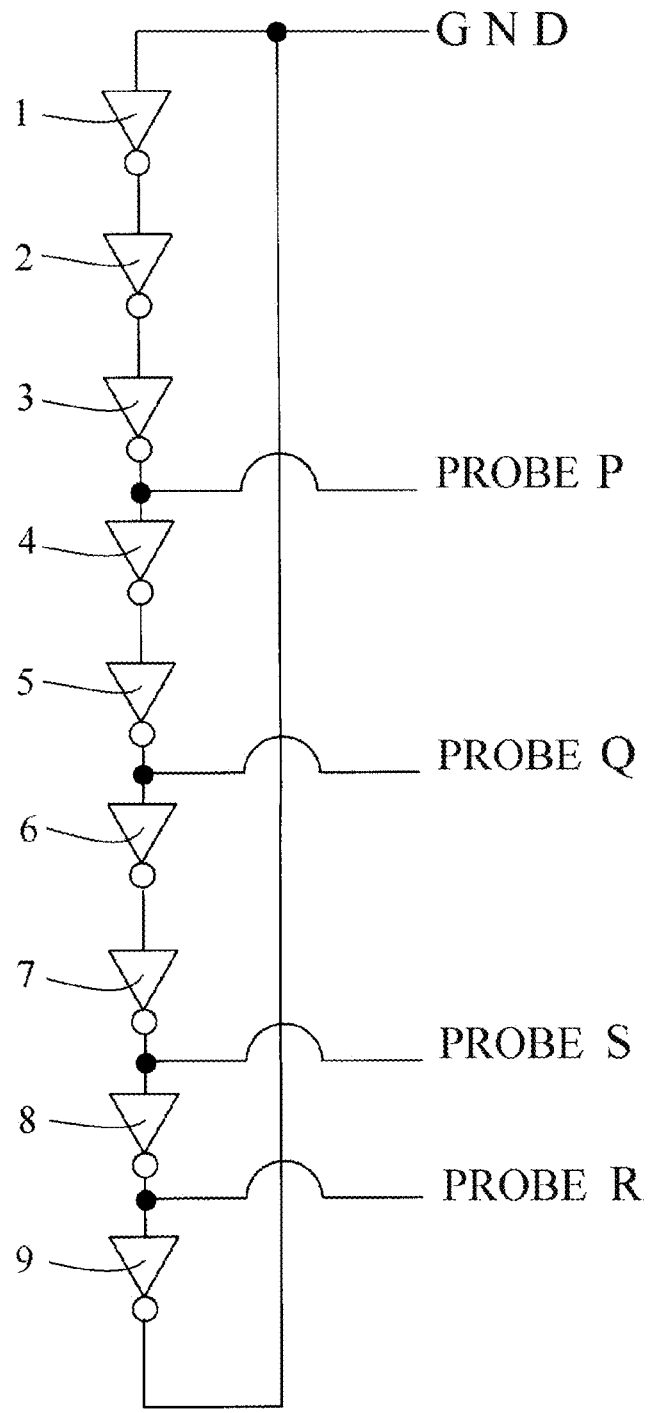
FIG. 1 is an explanation view of the oscillation method of the present invention.

The oscillation method of the present embodiment uses an oscillation circuit shown in FIG. 1. In FIG. 1, nine MOSFETs are annularly connected. HD74HC14P, in which MOSFET inverters are integrated and which is manufactured by Renesas Electronics Corporation, is used in the present embodiment.

An electric source is not shown in FIG. 1, but DC 1.4V is applied between a source terminal Vcc of the HD74HC14P and GND of the source terminal Vcc.

Figure 2:
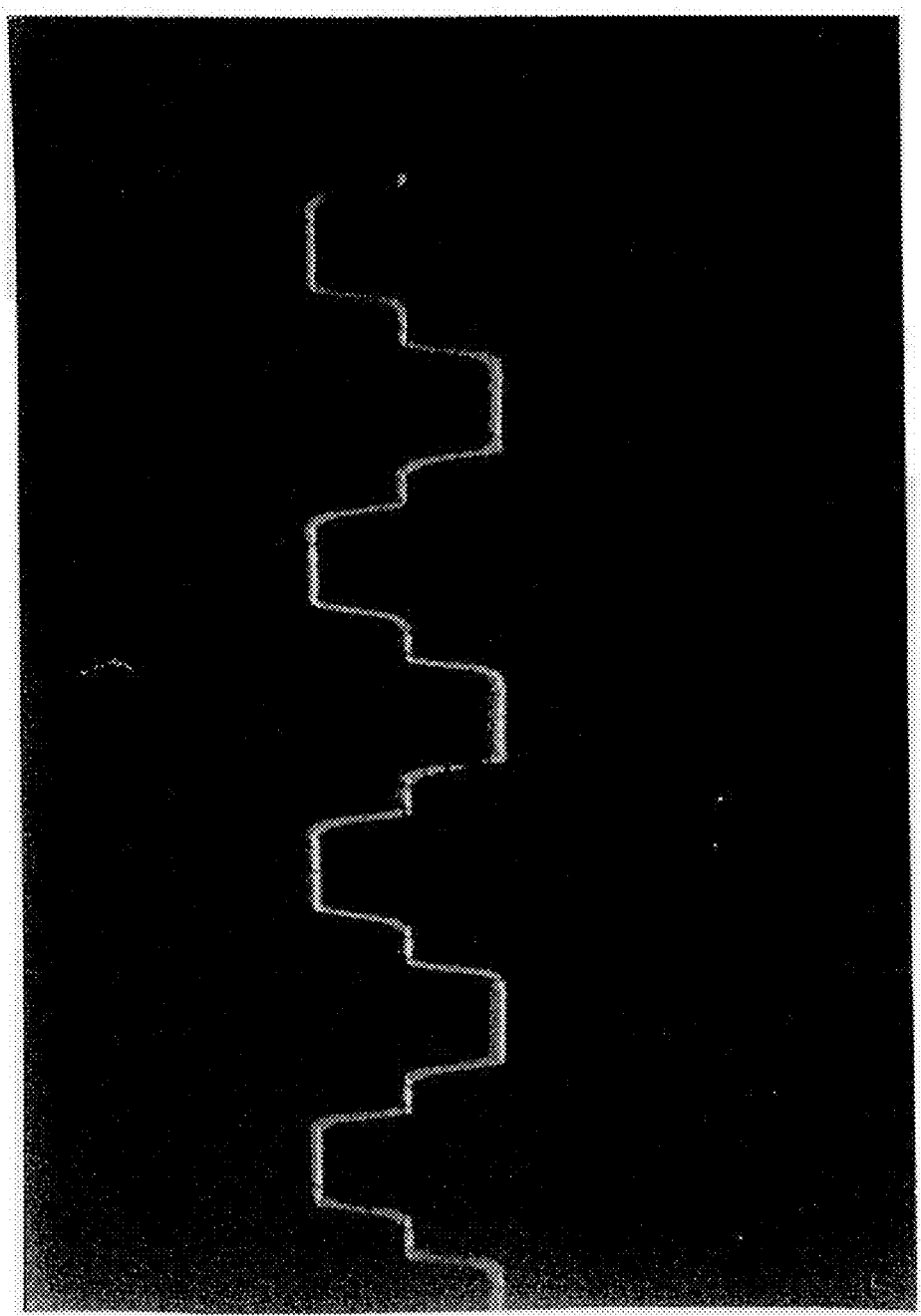
FIG. 2 is a waveform chart of pulse waves obtained at a probe P shown in FIG. 1.

GND of probes is connected with an anode of the uppermost inverter 1 of nine serially-connected inverters shown in FIG. 1. A probe P is connected with a cathode of the inverter 3, which is the third inverter from the inverter 1 connected with the GND. A waveform outputted from the inverter 3 is shown in FIG. 2.

Figure 3:
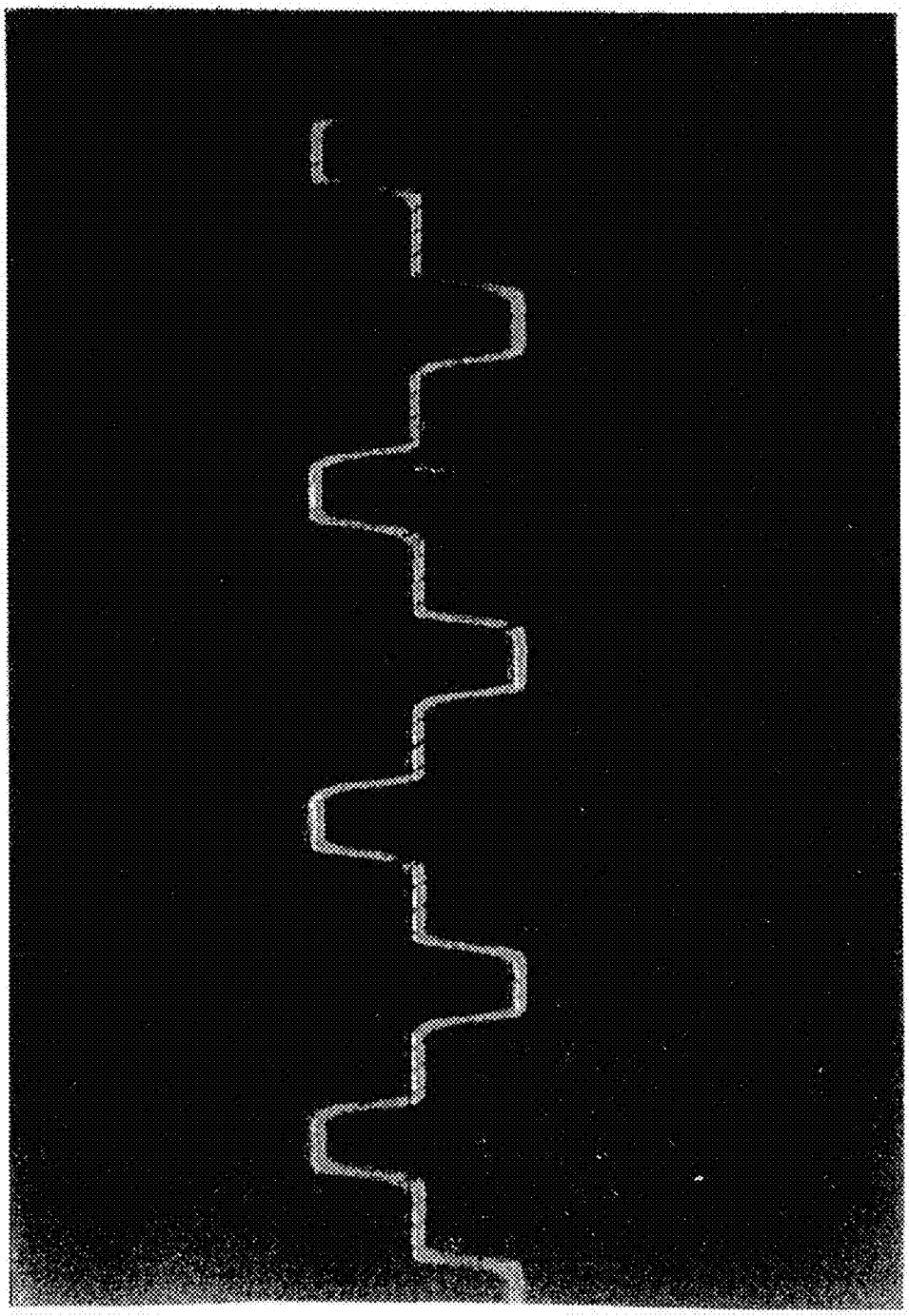
FIG. 3 is a waveform chart of pulse waves obtained at a probe Q shown in FIG. 1.

A probe Q is connected with a cathode of the inverter 5, which is the fifth inverter from the inverter 1 connected with the GND. A waveform outputted from the inverter 5 is shown in FIG. 3.

Figure 4:
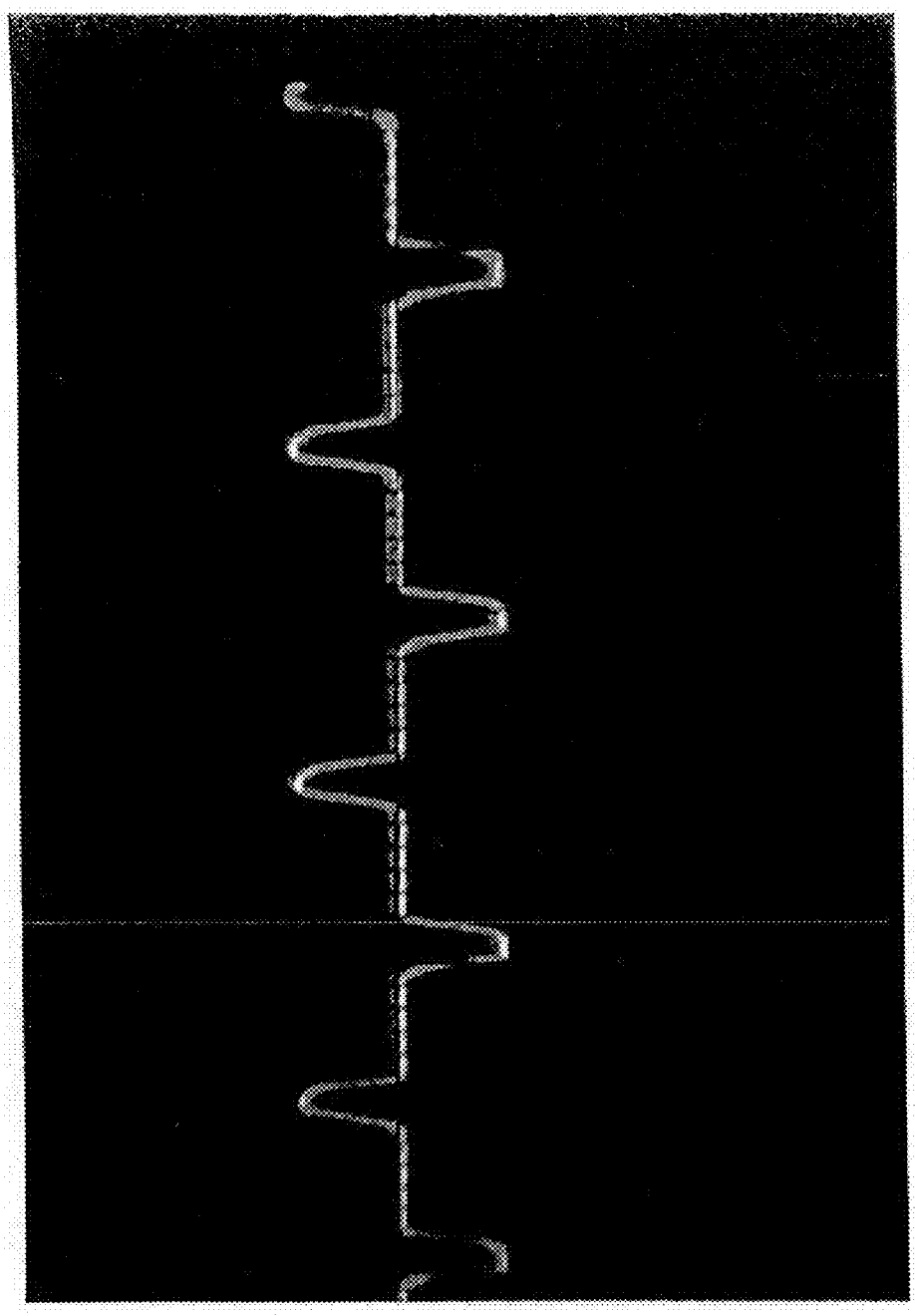
FIG. 4 is a waveform chart of pulse waves obtained at a probe S shown in FIG. 1.

A probe S is connected with a cathode of the inverter 7, which is the seventh inverter from the inverter 1 connected with the GND. A waveform outputted from the inverter 7 is shown in FIG. 4.

Figure 5:
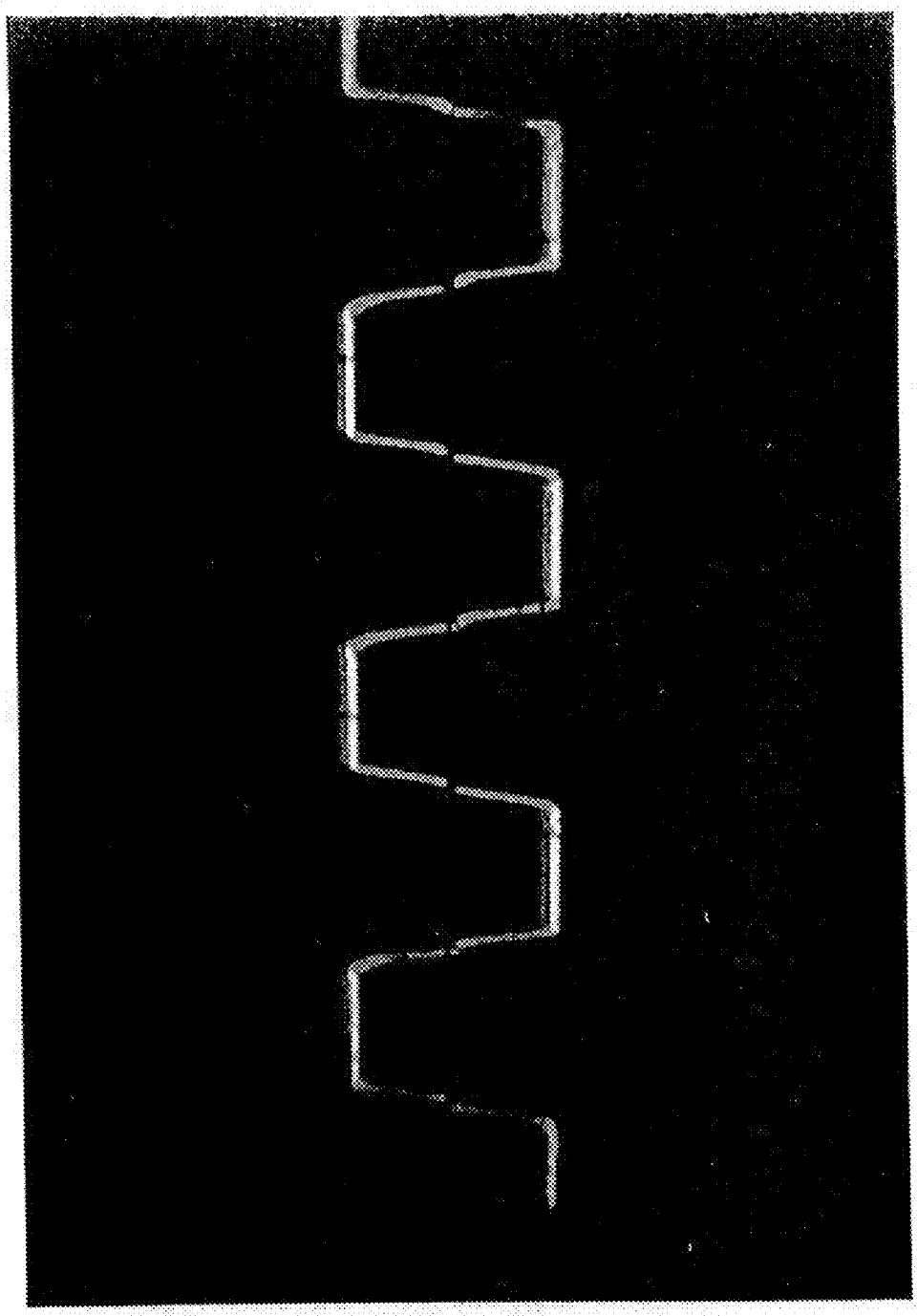
FIG. 5 is a waveform chart of pulse waves obtained at a probe R shown in FIG. 1.

A probe R is connected with a cathode of the inverter 8, which is the eighth inverter from the inverter 1 connected with the GND. A waveform outputted from the inverter 8 is shown in FIG. 5.

FIG. 2 shows the waveform oscillated by the three inverters. Two-step waves are repeatedly generated. Namely, the outputted waves are two-step-like waves.

FIG. 3 shows the waveform oscillated by the five inverters. Two-step waves are repeatedly generated. Namely, the outputted waves are two-step-like waves.

FIG. 4 shows the waveform oscillated by the seven inverters. A balance of pulse width of two-step-like waves in the time axis (horizontal axis) is different from that of the waveforms shown FIGS. 2 and 3, but the outputted waves are two-step-like waves as well as those shown in FIGS. 2 and 3.

FIG. 5 shows the waveform oscillated by the eight inverters.

Generally, a circuit in which an even number of inverters are annularly connected does not oscillate. However, in the present embodiment, the oscillation waveform can be obtained by the ring circuit including the eight inverters.

Note that, all of the waveforms shown in FIGS. 2-5 have an oscillation wavelength of 1960 nsec. (i.e., oscillation frequency is 510.204081 kHz). The wavelength 1960=7×7×40 (i.e., multiple of seven).

By obtaining the step-like waveform, easy calculation using the step-like waveform will be realized in the future.

In comparison with the waveforms shown in FIGS. 2, 4 and 5, the waveform or the shape of wave shown in FIG. 3 is well balanced. Preferably, five inverters are used so as to produce the desired step-like waveform.

In a star-connected circuit described later, number of inverters in a shortest path from any anode to a cathode connection point, through an odd number of inverters, is five. And, number of inverters in a shortest path from an anode connection point to any cathode, through an odd number of inverters, is also five. Thus, the inventor thinks that the above described oscillation method is applied to the star-connected circuit described later.

Next, a concrete oscillation circuit of the present embodiment will be explained.

The oscillation circuit of the present invention is constituted by a plurality of inverters. Firstly, an outline will be explained.

Figure 6:
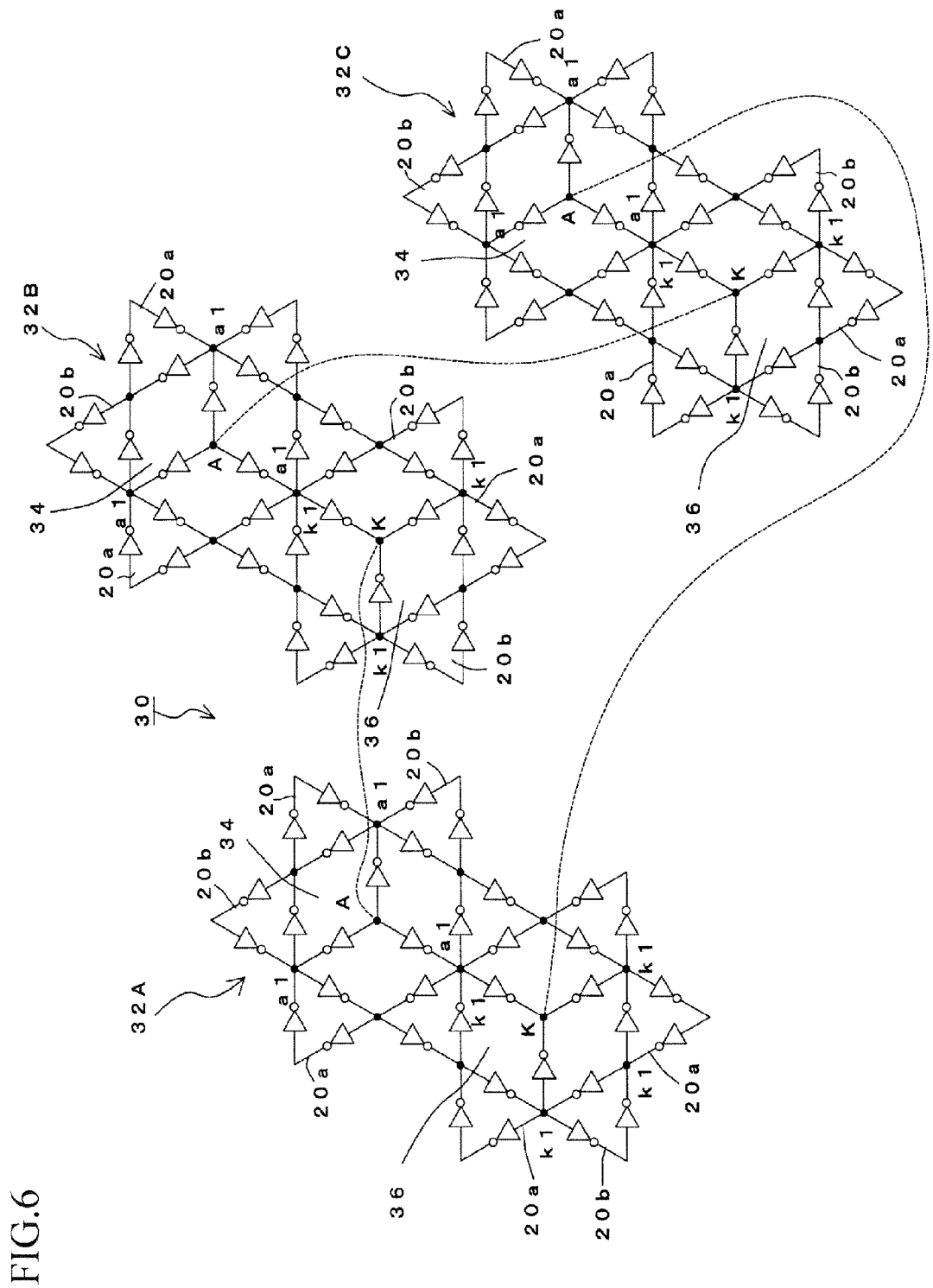
FIG. 6 is a schematic view of an oscillation circuit of an embodiment of the present invention.

As shown in FIG. 6, the oscillation circuit 30 of the present embodiment includes three parallel star-connected circuits 32A, 32B and 32C, in each of which two star-connected circuits 34 and 36 are planarly connected.

The three parallel star-connected circuits 32A, 32B and 32C have a same structure. In each of the parallel star-connected circuits 32A, 32B and 32C, the star-connected circuit 34 and the star-connected circuit 36 are partially overlapped or shared.

As described above, each of the parallel star-connected circuits 32A, 32B and 32C includes the two star-connected circuits 34 and 36. In the star-connected circuit 36, an electric current flows toward a center. On the other hand, in the star-connected circuit 34, the electric current flows outwardly from the center.

In the star-connected circuits 36, cathodes of the three inverters are connected at the center. The center is a cathode connection point K. On the other hand, in the star-connected circuits 34, anodes of the three inverters are connected at the center. The center is an anode connection point A.

The parallel star-connected circuits 32A, 32B and 32C are electrically connected. Namely, the anode connection point A of the parallel star-connected circuit 32A is electrically connected with the cathode connection point K of the parallel star-connected circuit 32B. The cathode connection point K of the parallel star-connected circuit 32A is electrically connected with the anode connection point A of the parallel star-connected circuit 32C. Further, the cathode connection point K of the parallel star-connected circuit 32C is electrically connected with the anode connection point A of the parallel star-connected circuit 32B.

Note that, in FIG. 6, connection lines between the parallel star-connected circuits 32A, 32B and 32C are shown by dotted lines.

In FIG. 6, the three parallel star-connected circuits 32A, 32B and 32C are arranged in a plane, but the arrangement of the parallel star-connected circuits 32A, 32B and 32C is not limited as far as they are electrically connected with each other.

Next, the parallel star-connected circuits will be explained.

Each of the parallel star-connected circuits 32A, 32B and 32C includes the two star-connected circuits 34 and 36, which share a part of the inverters.

Each of the star-connected circuits 34 and 36 has six small circuits 20a, 20b, in each of which three inverters are annularly connected. In each of the small circuits 20, the inverters are orientated in a same circumferential direction, so that each of the small circuits 20 can act as a ring oscillator.

In each of the small circuits 20, the three inverters are triangularly-arranged. In case that the three inverters are arranged in a plane, the electric current flows in two directions, i.e., clockwise direction and counterclockwise direction.

Note that, the orientation of the inverters in each of the small circuits 20 can be oppositely changed by turning over the small circuit 20. Therefore, the flowing direction of the electric current can be controlled by orientation of the inverters in the small circuits 20.

Each of the star-connected circuits 34 and 36 is constituted by connecting the six small circuits 20. Six selected inverters, each of which is one selected from the three inverters constituting each of the small circuits 20, are annularly connected to form each side of a hexagonal shape in each of the star-connected circuits 34 and 36.

Note that, in each of the star-connected circuits 34 and 36, the direction of the electric current in the six small circuits 20 constituting an outer peripheral part of the star-connected circuit is alternately changed, so the current directions in the adjacent small circuits 20 are different. Namely, the small circuit 20a, in which the electric current flows clockwise, is connected with the adjacent small circuits 20b, in each of which the electric current flows counterclockwise; the small circuit 20b, in which the electric current flows counterclockwise, is connected with the adjacent small circuits 20a, in each of which the electric current flows clockwise.

In the star-connected circuit 34 having the anode connection point A, the hexagonal shape, which is constituted by the six small circuits 20, has three connection points a1, which are located at the corners of the hexagonal shape and at each of which the anodes of the inverters constituting the hexagonal shape are connected with each other. Further, inverters are provided between the connection points a1 and the center of the star-connected circuit 34. The cathodes of those inverters are respectively connected with the connection points a1.

The adjacent inverters which constitute the sides of the hexagonal shape of the star-connected circuit 34 and which are connected with each other are oppositely oriented. Therefore, number of the connection points a1, at each of which the anodes are connected with each other, is three. Further, number of the inverters which are connected between the connection points a1 and the center of the star-connected circuit 34 is also three. Anodes of these three inverters are connected with each other at the anode connection point A.

In the star-connected circuit 36 having the cathode connection point K, the hexagonal shape, which is constituted by the six small circuits 20, has three connection points k1, which are located at the corners of the hexagonal shape and at each of which the cathodes of the inverters constituting the hexagonal shape are connected with each other. Further, inverters are provided between the connection points k1 and the center of the star-connected circuit 36. The anodes of those inverters are respectively connected with the connection points k1.

The adjacent inverters which constitute the sides of the hexagonal shape of the star-connected circuit 36 and which are connected with each other are oppositely oriented. Therefore, number of the connection points k1, at each of which the cathodes are connected with each other, is three. Further, number of the inverters which are connected between the connection points k1 and the center of the star-connected circuit 36 is also three. Cathodes of these three inverters are connected with each other at the cathode connection point K.

The star-connected circuit 34 having the anode connection point A and the star-connected circuit 36 having the cathode connection point K are connected with each other by sharing the two small circuits 20a and 20b. In the sharing part, the cathode of the inverter connected with the anode connection point A of the star-connected circuit 34 is connected with the anode of the inverter connected with the cathode connection point K of the star-connected circuit 36. Therefore, in one of the parallel star-connected circuits, the shortest path between the anode connection point A of the star-connected circuit 34 and the cathode connection point K of the star-connected circuit 36 is constituted by the two inverters.

The oscillation circuit of the present embodiment includes the three parallel star-connected circuits 32A, 32B and 32C. For example, the cathode connection point K of the parallel star-connected circuit 32A is connected with the anode connection point A of the parallel star-connected circuit 32B, the cathode connection point K of the parallel star-connected circuit 32B is connected with the anode connection point A of the parallel star-connected circuit 32C, and the cathode connection point K of the parallel star-connected circuit 32C is connected with the anode connection point A of the parallel star-connected circuit 32A.

Figure 7:
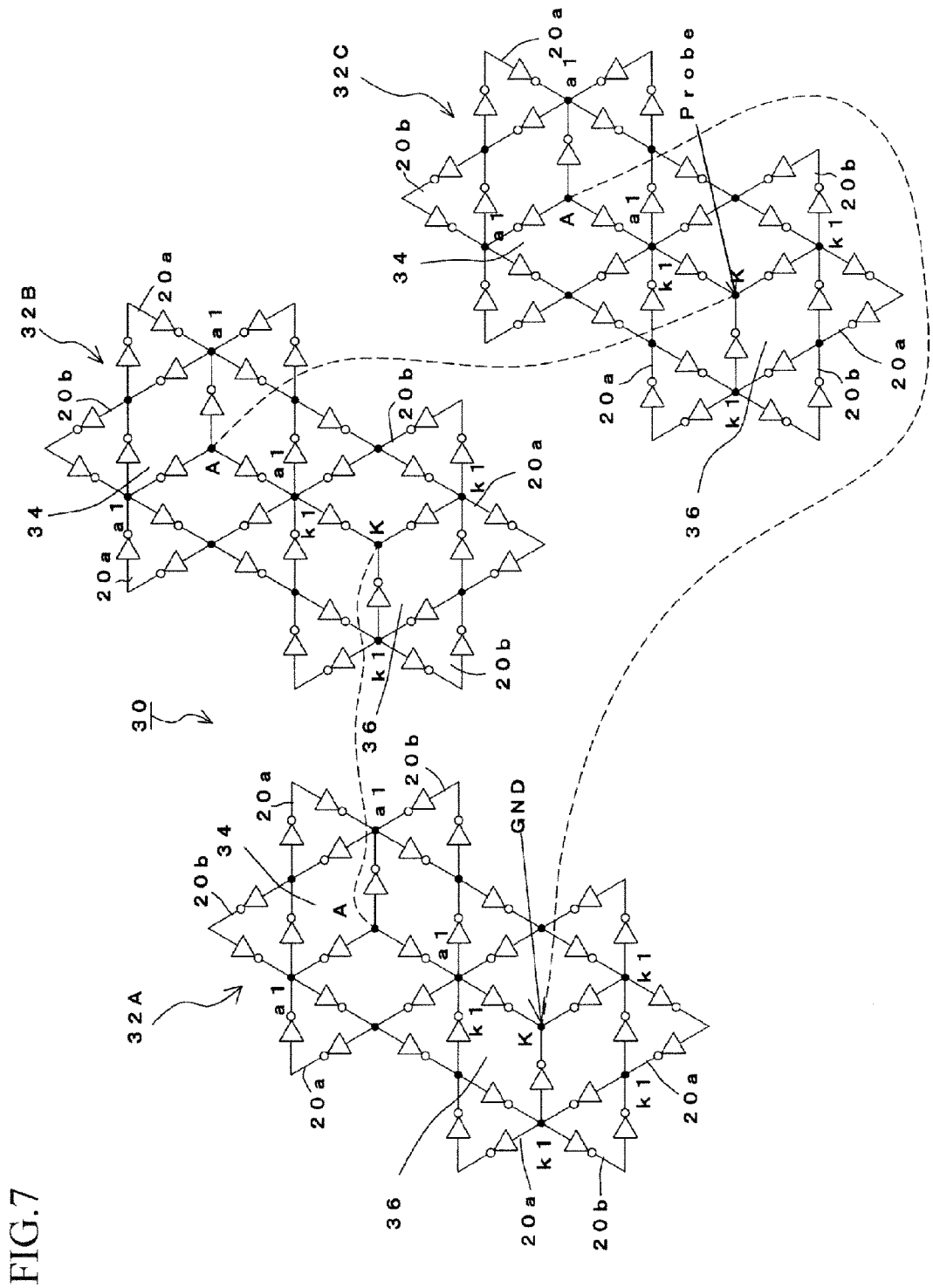
FIG. 7 is an explanation view showing measuring points.

As shown in FIG. 7, the anode connection point A of one of the parallel star-connected circuits acts as GND. The probes may be connected with the anode connection points A and the cathode connection points K other than GND. With this structure, step-like pulse waves can be outputted.

Experimental Example

The inventor of the present invention actually manufactured the oscillation circuit of the present embodiment and measured a waveform.

Figure 8:
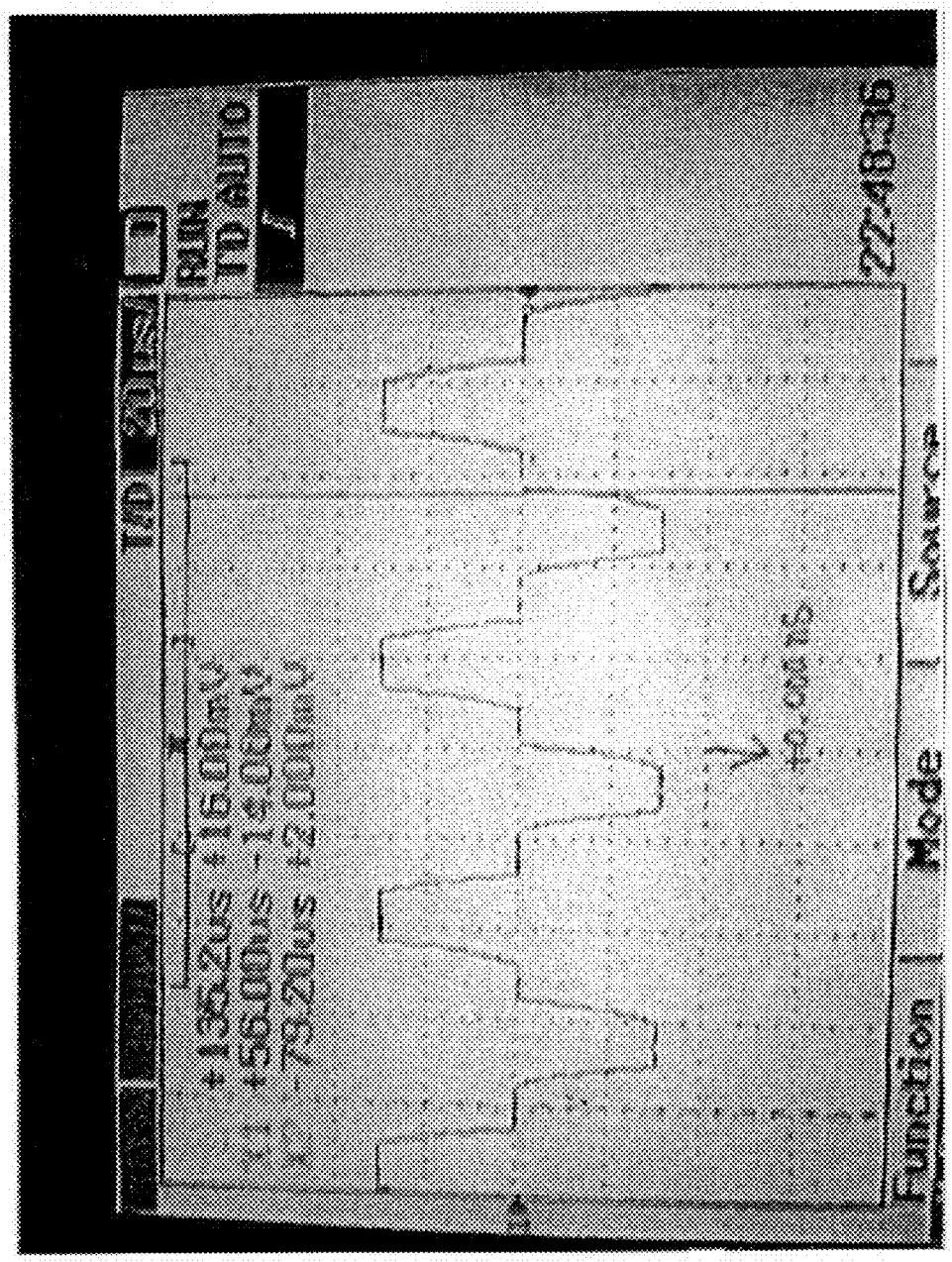
FIG. 8 is an explanation view of actually measured pulse waves.

HD74HC14P manufactured by Renesas Electronics Corporation was used as the inverters, and the inverters were connected as shown in FIG. 2. DC 1.202 V was supplied to the HD74HC14P. U1600B manufactured by Agilent Technologies was used as a handle type measuring instrument As shown in FIG. 8, the oscillation circuit repeatedly outputted step-like pulses whose wave length was 56 μsec. and each of which had a maximum value, an intermediate value and a minimum value. Since the wave length was 56 μsec., a frequency was 17857.142857 Hz.

Note that, an oscillation wavelength shown in FIG. 8, i.e., 56 (7×8), was a multiple of seven. By using the oscillation method and the oscillation circuit, the oscillation wavelength of multiple of seven can be obtained.

A characteristic point of the present embodiment is setting the points for measuring outputted waveforms. In the oscillation circuit, GND of the circuit is connected with any one of the anode connection points and the cathode connection points of the parallel star-connected circuits. GND of the electric source circuit is not connected with the anode connection points and the cathode connection points. The inventor thinks that the unique waveform shown in FIG. 8 is generated by this unique circuit structure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alternations could be made hereto without departing from the spirit and scope of the invention.

What is claimed is:

1. An oscillation circuit,
comprising a first parallel star-connected circuit, a second parallel star-connected circuit and a third parallel star-connected circuit, which have a same circuit configuration,
wherein each of the parallel star-connected circuits includes a first star-connected circuit having six small circuits, in each of which three inverters are annularly connected,
the inverters are connected to flow an electric current clockwise in three of the small circuits,
the inverters are connected to flow the electric current counterclockwise in the rest three small circuits,
six selected inverters, each of which is one selected from the three inverters constituting each of the small circuits, are connected to form a hexagonal shape,
anodes of the inverters are connected at three corners of the hexagonal shape, cathodes of the inverters are connected at the rest three corners thereof,
the anodes of the inverters are respectively connected at the three corners at each of which the cathodes are connected, and
the cathodes connected at the rest three corners are connected at a cathode connection point,
wherein each of the parallel star-connected circuit includes a second star-connected circuit having six small circuits, in each of which three inverters are annularly connected,
the inverters are connected to flow the electric current clockwise in three of the small circuits,
the inverters are connected to flow the electric current counterclockwise in the rest three small circuits,
six selected inverters, each of which is one selected from the three inverters constituting each of the small circuits, are connected to form a hexagonal shape,
anodes of the inverters are connected at three corners of the hexagonal shape, cathodes of the inverters are connected at the rest three corners thereof,
the cathodes of the inverters are respectively connected at the three corners at each of which the anodes are connected, and
the anodes connected at the rest three corners are connected at an anode connection point, wherein, in each of the parallel star-connected circuits, the two small circuits of the first star-connected circuit and the two small circuits of the second star-connected circuit are shared to connect the first star-connected circuit with the second star-connected circuit, and
wherein the anode connection point of the first parallel star-connected circuit is connected with the cathode connection point of the second parallel star-connected circuit, the anode connection point of the second parallel star-connected circuit is connected with the cathode connection point of the third parallel star-connected circuit, and the anode connection point of the third parallel star-connected circuit is connected with the cathode connection point of the first parallel star-connected circuit.

* * * * *